(12) United States Patent
Nanjo et al.

(10) Patent No.: US 6,858,914 B2
(45) Date of Patent: Feb. 22, 2005

(54) SEMICONDUCTOR DEVICE WITH FUSES

(75) Inventors: Ryota Nanjo, Kawasaki (JP); Satoshi Otsuka, Kawasaki (JP); Toyoji Sawada, Kawasaki (JP); Kazuo Sukegawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/695,876

(22) Filed: Oct. 30, 2003

(65) Prior Publication Data
US 2004/0089915 A1 May 13, 2004

(30) Foreign Application Priority Data
Oct. 31, 2002 (JP) ........................................ 2002-318908

(51) Int. Cl.[7] ......................... H01L 29/00; H01L 23/48; H01L 23/52; H01L 29/40
(52) U.S. Cl. ...................................... 257/529; 257/758
(58) Field of Search .......................... 257/529, 758–776

(56) References Cited

U.S. PATENT DOCUMENTS 6,261,883 B1 * 7/2001 Koubuchi et al. .......... 257/776
6,452,284 B1 * 9/2002 Sheck ........................ 257/797
6,614,120 B2 * 9/2003 Sato et al. .................. 257/758
6,649,997 B2 * 11/2003 Koike ........................ 257/529

FOREIGN PATENT DOCUMENTS

JP        11-345880        12/1999

* cited by examiner

*Primary Examiner*—Cuong Nguyen
(74) *Attorney, Agent, or Firm*—Westerman, Hattori, Daniels & Adrian, LLP

(57) ABSTRACT

A semiconductor device has: a semiconductor substrate having a principal surface; a fuse circuit formed above the principal surface, the fuse circuit having fuse elements each having a predetermined breaking point; a first trench isolation region formed in a surface layer of the semiconductor substrate under the fuse circuit; and a plurality of active region dummies formed through the first trench isolation region in an area excepting a predetermined area around the predetermined breaking point. Although a dummy structure is formed also in a fuse circuit, a breaking margin is prevented from being lowered and a substrate damage is avoided, while surface flatness and line width controllability are ensured.

10 Claims, 12 Drawing Sheets

SEMICONDUCTOR DEVICE WITH FUSES

CROSS REFERENCE TO RELATED APPLICATION

This application is based on and claims priority of Japanese Patent Application No. 2002-318908 filed on Oct. 31, 2002, the entire contents of which are incorporated herein by reference.

BACKGROUND OF THE INVENTION

1 A) Field of the Invention

The present invention relates to a semiconductor device, and more particularly to a semiconductor device having a fuse circuit and a dummy structure not functioning as an electronic circuit. The dummy structure may be an active region dummy, a gate electrode dummy and the like.

2 B) Description of the Related Art

Since the integration degree of recent semiconductor integrated circuit devices is high, shallow trench isolation (STI) excellent in planarization has been adopted as isolation techniques in place of local oxidation of silicon (LOCOS). Since the gate length is becoming shorter than ever, a high patterning precision is required to form a gate electrode.

For example, a buffer silicon oxide film and a silicon nitride film are formed on a silicon substrate, and an opening is formed through the buffer silicon oxide film and silicon nitride film, the opening having a shape corresponding to an isolation region which defines active regions. By using the silicon nitride film as a mask, the silicon substrate is etched to form an element separation or isolation trench.

An insulating layer such as a silicon oxide film is deposited to bury or embed the isolation trench with the insulating layer. An unnecessary insulating film deposited on the silicon nitride film is removed by chemical mechanical polishing (CMP). With the above processes, such a silicon substrate can be obtained which has an STI type isolation region and a flat surface.

The silicon nitride film used as the mask is removed and necessary ion implantation is performed to form desired wells. Thereafter, a gate oxide film and a polysilicon film are formed on the surface of the active region. The gate oxide film and polysilicon film are patterned to form a gate electrode (and word line) through anisotropic etching using a photoresist pattern. The gate electrode having a short gate length can be formed through high precision patterning.

After ions are implanted into the regions on both sides of the gate electrode to form extension regions, an insulating film such as a silicon oxide film is deposited and anisotropic etching is performed to form side wall spacers from the insulating film. By using the gate electrode and side wall spacers as a mask, ion implantation is performed to form deep and high impurity concentration source/drain regions. Annealing is performed to activate implanted impurity ions.

If the resistances of the gate electrode and source/drain regions are to be reduced, metal capable of silicidation such as Co or Ni is deposited over the silicon substrate and a silicide layer is formed on the silicon surface by a silicide process.

Thereafter, an interlayer or interlevel insulating film is deposited burying or embedding the gate electrode. An irregular surface due to the gate electrode and the like is planarized by CMP. Contact holes for deriving leads are formed through anisotropic etching. Local interconnect grooves may be formed at the same time. A metal layer such as a lamination of Ti, TiN and W is deposited to fill or bury the contact holes and other grooves with the metal layer. An unnecessary metal layer deposited on the surface of the interlayer insulating film is removed by CMP or the like. In this manner, contact plugs deriving upward the electrodes of a semiconductor device can be formed. Thereafter, necessary upper level wirings and interlayer insulating films will be formed.

If the distribution of areas of the isolation region has a large variation in an STI process, the central area of the silicon oxide film buried in a trench having a large width is polished faster than other areas, resulting in dishing. In an active region having a small width sandwiched between trench isolation regions having a large width or in a region where active regions having a small width are dense, CMP does not stop at the silicon nitride film and the active regions may be excessively polished, resulting in erosion.

If the flatness of the substrate surface is lost because of such phenomena, a later lithography process is adversely affected. High precision photolithography requires a flat surface of an underlying layer. If the surface is irregular, an image transfer precision of photolithography lowers. In order to guarantee the surface flatness, it is desired to form such an isolation region which disposes active region dummies in addition to active regions for making semiconductor elements.

Gate electrodes on the surface of a silicon substrate have a high integration degree. The highest patterning precision is required to form such gate electrodes. If the distribution of gate electrodes to be etched from a conductive layer has a variation, etch rates change with this variation. It is desired to form gate electrode dummies in order to make the distribution of gate electrodes uniform.

Such dummy patterns are generally usually automatically designed in accordance with the data processing compatible with some rules in order to reduce a design load. Some problems may occur if dummy structures are formed in such a way.

It is becoming more difficult to maintain a high yield in manufacturing highly integrated semiconductor devices. To increase the yield, generally redundant circuits are prepared to replace defective circuits with redundant circuits to recover the function of the semiconductor device. A fuse circuit is used for the replacement with the redundant circuit.

It is necessary to properly design the fuse element so as not to erroneously break it, by taking into consideration the spot diameter of a laser beam. The fuse element requires a relatively large area depending upon the spot diameter of a laser beam.

As the scale of redundant circuit becomes large and the number of fuse elements increases correspondingly, the area of a fuse circuit occupied in a semiconductor substrate becomes large. A dummy pattern DP for planarization is required to be inserted also inside a guard ring GR, similar to an ordinary circuit.

As described above, a pattern of active region dummies and gate electrode dummies is generally automatically designed. This is also true for a dummy pattern in a fuse circuit. As a dummy pattern is disposed in the fuse circuit, a margin of a fuse breaking process may be lowered or the substrate may be damaged.

There is a proposal to form a block layer of tungsten under the fuse circuit. Each fuse is broken through laser abrasion. The block layer stops the laser abrasion with good controllability. (Refer to JP-A-HEI-11-345880)

SUMMARY OF THE INVENTION

An object of this invention is to provide a semiconductor device having a dummy structure also in a fuse circuit and being able to maintain surface flatness and line width controllability while a breaking margin is prevented from being lowered and a substrate damage is avoided.

According to one aspect of the present invention, there is provided a semiconductor device comprising: a semiconductor substrate having a principal surface; a fuse circuit formed above the principal surface, the fuse circuit having fuse elements each having a predetermined breaking point; a first trench isolation region formed in a surface layer of the semiconductor substrate under the fuse circuit; and a plurality of active region dummies formed through the first trench isolation region in an area excepting a predetermined area around the predetermined breaking point.

According to another aspect of the present invention, there is provided a semiconductor device comprising: a semiconductor substrate having a principal surface; a fuse circuit formed above the principal surface, the fuse circuit having fuse elements each having a predetermined breaking point; a first trench isolation region formed in a surface layer of the semiconductor substrate under the fuse circuit; a plurality of active region dummies formed through the first trench isolation region; and an insulting film covering a semiconductor surface of the active region dummies.

As above, even if the dummy structure is disposed, the adverse influence of the dummy structure upon the breaking characteristics of the fuse circuit can be mitigated and the influence upon a substrate damage can also be reduced.

DESCRIPTION OF THE PREFERRED EMBODIMENTS

First, new facts found during the developments by the present inventors will be described. An example of dummy region forming processes will be described first.

Figure 9A:
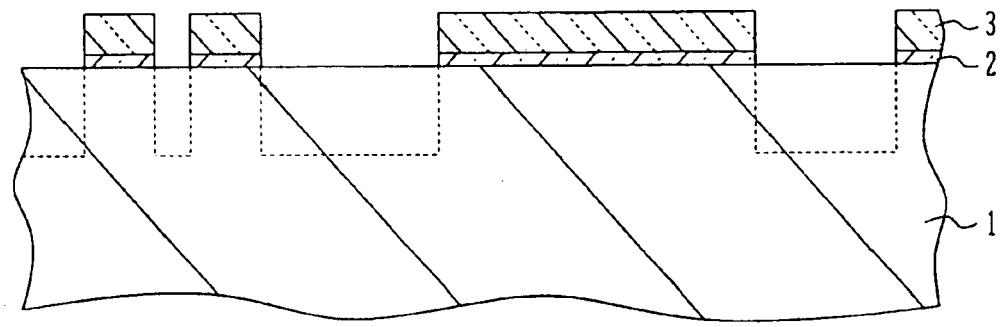
FIGS. 9A to 9I are cross sectional views illustrating dummy pattern forming processes according to related art.

As shown in FIG. 9A, on the surface of a silicon substrate 1, a silicon oxide film 2 is grown to a thickness of about 10 nm through oxidation by hydrochloric acid at 900° C. On this silicon oxide film 2, a silicon nitride film 3 is grown to a thickness of about 110 nm by chemical vapor deposition (CVD).

A resist pattern is formed on the silicon nitride film 3, and the silicon nitride film 3 and silicon oxide film 2 are etched through anisotropic etching. The resist pattern is thereafter removed. By using the silicon nitride film 3 as a mask, the silicon substrate 1 is subjected to anisotropic etching. For example, a silicon substrate surface layer of about 300 nm thick is etched to form a trench having a depth of about 300 nm.

Figure 9B:
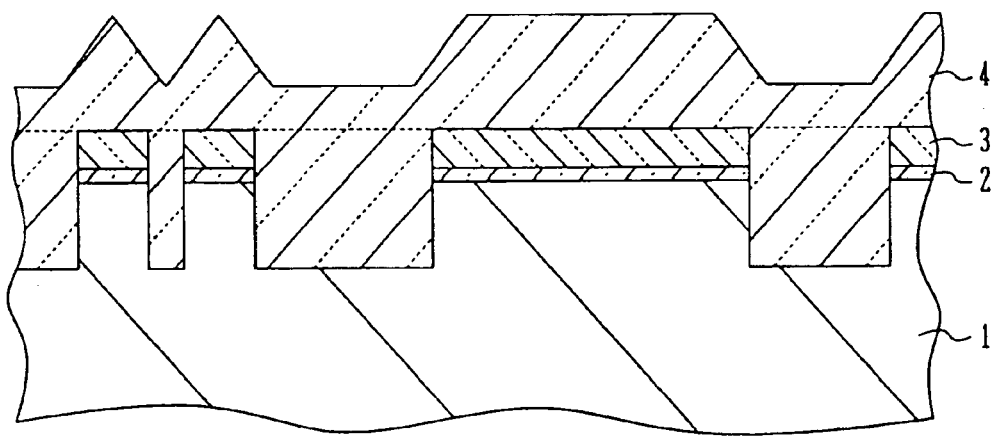

As shown in FIG. 9B, on the silicon substrate formed with trenches, a silicon oxide film 4 is grown to a thickness of about 500 nm by CVD. An unnecessary silicon oxide film 4 deposited on the silicon nitride film 3 is removed by chemical mechanical polishing (CMP). The silicon nitride film 3 functions as a CMP stopper. Trench isolation regions are therefore formed. By forming active region dummies, the density of areas of the isolation or element separation region can be made uniform so that dishing and erosion can be suppressed.

Figure 9C:
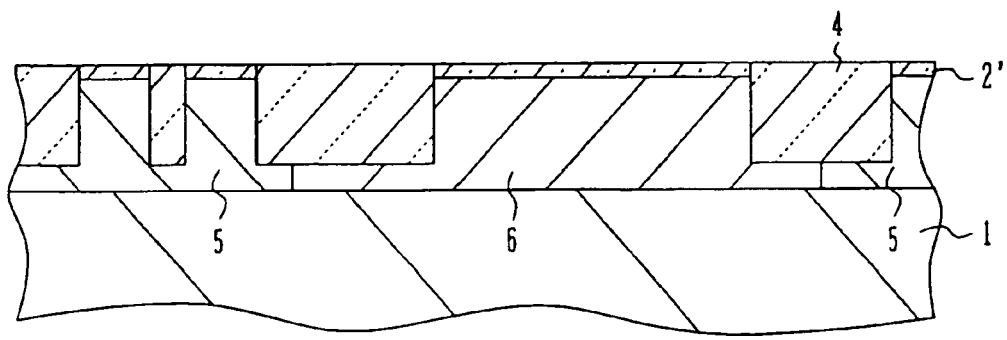

As shown in FIG. 9C, the silicon nitride film 3 is removed by hot phosphoric acid solution. The silicon oxide film 2 may be removed by hydrofluoric acid solution. In this case, a new silicon oxide film 2' is grown to a thickness of about 10 nm through oxidation by hydrochloric acid at 900° C. A resist mask separating the n- and p-channel regions is formed on the surface of the silicon substrate 1 and ion implantation for each of the n- and p-channel regions is performed to form wells.

For example, impurity ions are implanted at a dose of about $1 \times 10^{13}$ cm$^{-2}$. After an n-well 6 and a p-well 5 are formed, the silicon oxide film 2' used for ion implantation is removed.

Figure 9D:
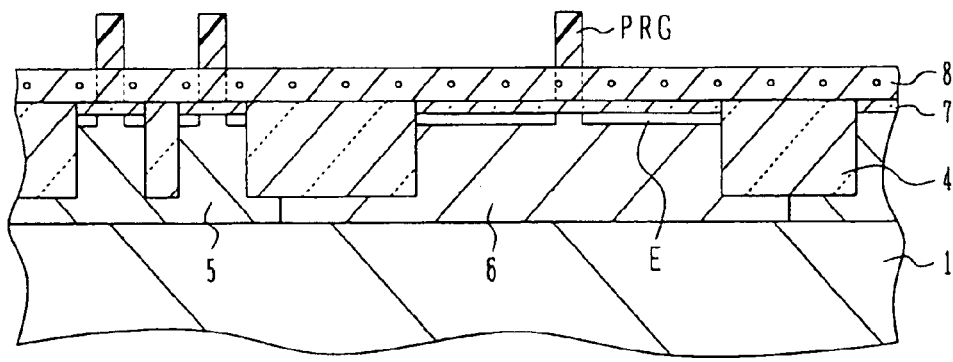

As shown in FIG. 9D, a gate oxide film 7 is grown to a thickness of about 1 nm on the exposed silicon surface by thermal oxidation. On this gate oxide film 7, a polysilicon layer 8 is formed to a thickness of about 110 nm by CVD. On the polysilicon layer 8, a resist pattern PRG for gate electrodes is formed. This pattern includes also the pattern for gate electrode dummies. By using the resist pattern PRG as a mask, the polysilicon layer 8 is etched. A gate electrode is therefore formed above the active region. Gate electrode dummies are also formed above the active region dummies.

If isolated gate electrodes and dense gate electrodes are mixed, the isolated gate electrode is likely to be etched excessively. By disposing gate electrode dummies, etching of gate electrodes can be made uniformly. Next, ion implantation is performed at a dose of, for example, about $1 \times 10^{14}$ cm$^{-2}$ for each of p- and n-channel regions to form shallow extension regions E. When a mask is used in this ion implantation, the dummy region may be masked not to form extention.

Figure 9E:
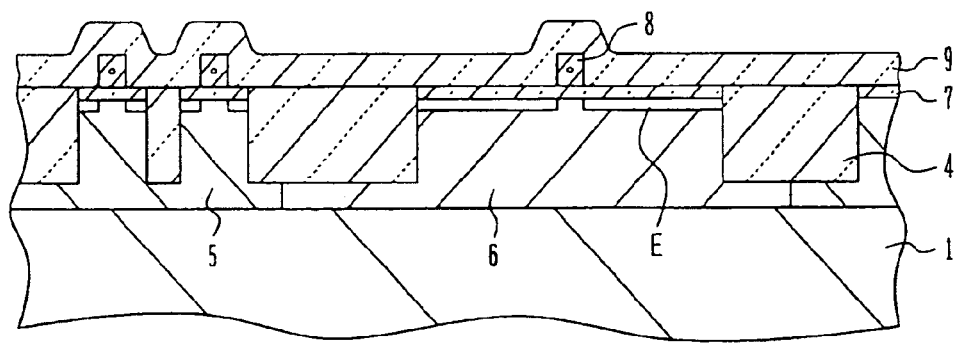

As shown in FIG. 9E, on the substrate surface, a silicon oxide layer 9 having a thickness of about 100 nm is formed by CVD. The silicon oxide film 9 is subjected to anisotropic etching to remove the silicon oxide film 9 on the flat surface. The silicon oxide film 9 is left on the side walls of the gate electrode 8 to form side wall spacers.

Figure 9F:
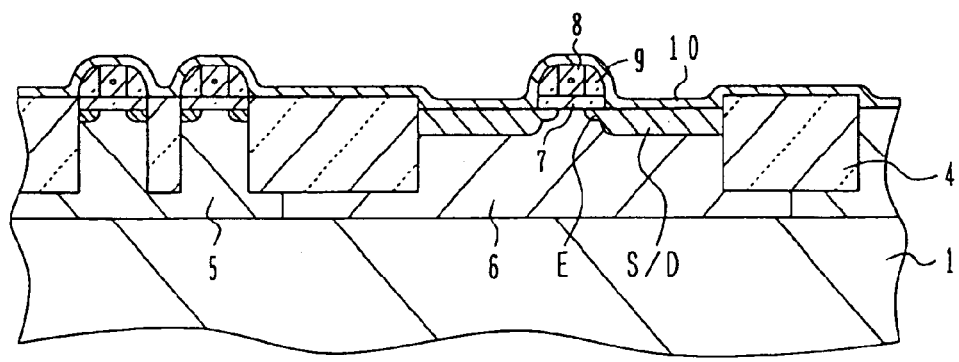

As shown in FIG. 9F, ion implantation is performed at a high impurity concentration, for example, at a dose of about $1 \times 10^{15}$ cm$^{-2}$, for each of p- and n-channel regions to form deep source/drain regions S/D having a high impurity concentration. After ion implantation, rapid thermal annealing (RTA) is performed at about 1050° C. to activate implanted ions.

Next, on the surface of the substrate 1, a cobalt film 10 having a thickness of, for example, 5 nm is formed by sputtering. Annealing at about 850° C. is performed to form a cobalt silicide layer on the surfaces of the gate electrodes and on the exposed surfaces of the source/drain regions S/D.

Figure 9G:
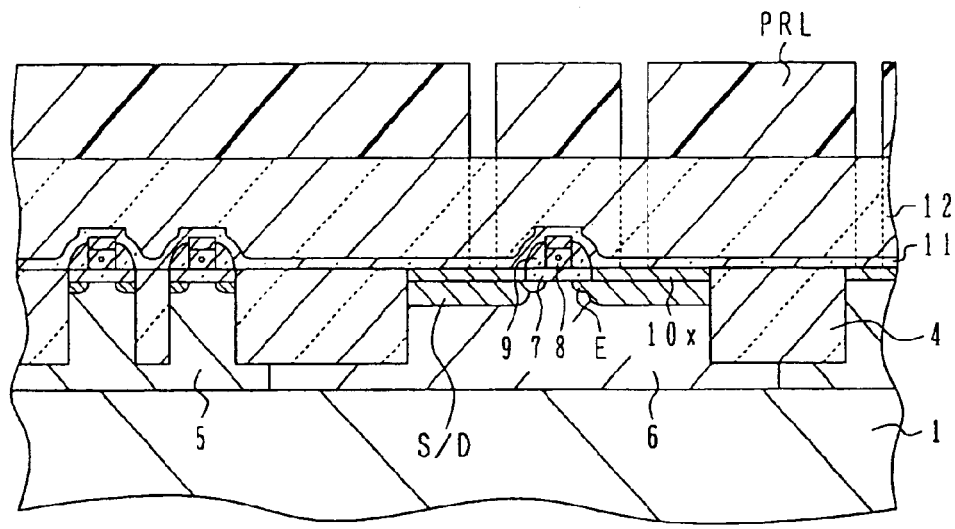

As shown in FIG. 9G, after the cobalt silicide layer 10x is formed, an unreacted metal layer is removed and a silicon nitride film 11 is deposited to a thickness of about 40 nm by CVD. On the silicon nitride film 11, a silicon oxide film 12 is formed having a thickness of about 650 nm. The surface of the silicon oxide film 12 is planarized by CMP. A photoresist pattern PRL is formed on the planarized surface and contact holes are formed by anisotropic etching. After etching, the photoresist patter PRL is removed.

Figure 9H:
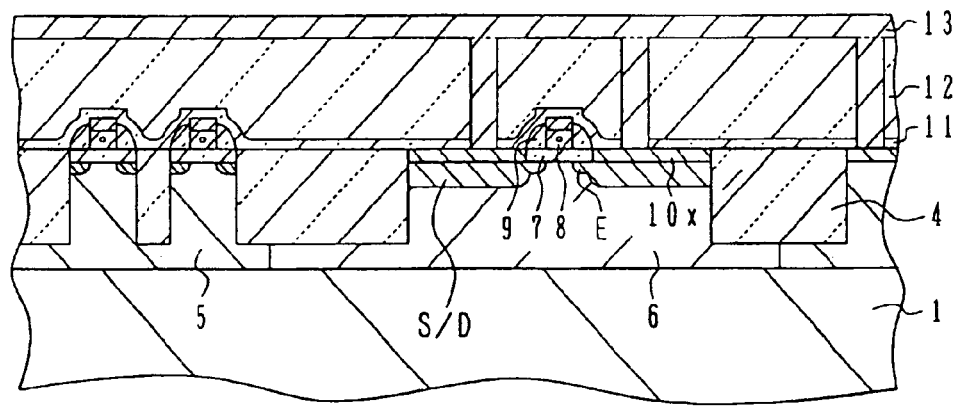

As shown in FIG. 9H, on the surface of the substrate formed with contact holes, a titanium film and a titanium nitride film each having a thickness of about 10 nm are formed by CVD. A tungsten film having a thickness of about 200 nm is formed on the titanium nitride film by CVD. Each contact hole is therefore filled or buried with a contact plug made of a laminated metal layer 13. An unnecessary metal layer deposited on the silicon oxide film 12 is removed by CMP. A local interconnect may also be formed at the same time when the contact plug is formed. In this manner, a MOS transistor is formed on the right side of FIG. 9H and a dummy structure is formed on the left side.

Figure 9I:
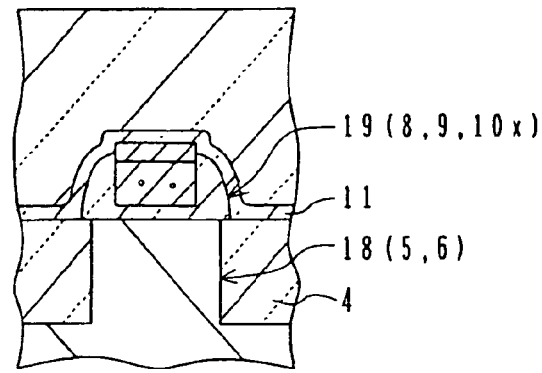

FIG. 9I is a schematic cross sectional view showing the structure of the dummy region formed in the manner described above. An active region dummy 18 is formed by partially removing the isolation or element separation region 4. Extention is not formed in the active region dummy 18. A gate electrode dummy 19 is formed above the active region dummy.

In the example described above, a laminated dummy structure is made of a lamination of the active region dummy and a gate electrode dummy. By forming the active region dummy and gate electrode dummy in the same area, it becomes easy to make parasitic capacitances uniform and prevent electric shortage between wells. The laminated dummy structure is not limited only to that described above. Either one of the active region dummy and gate electrode dummy may be formed.

Figure 10:
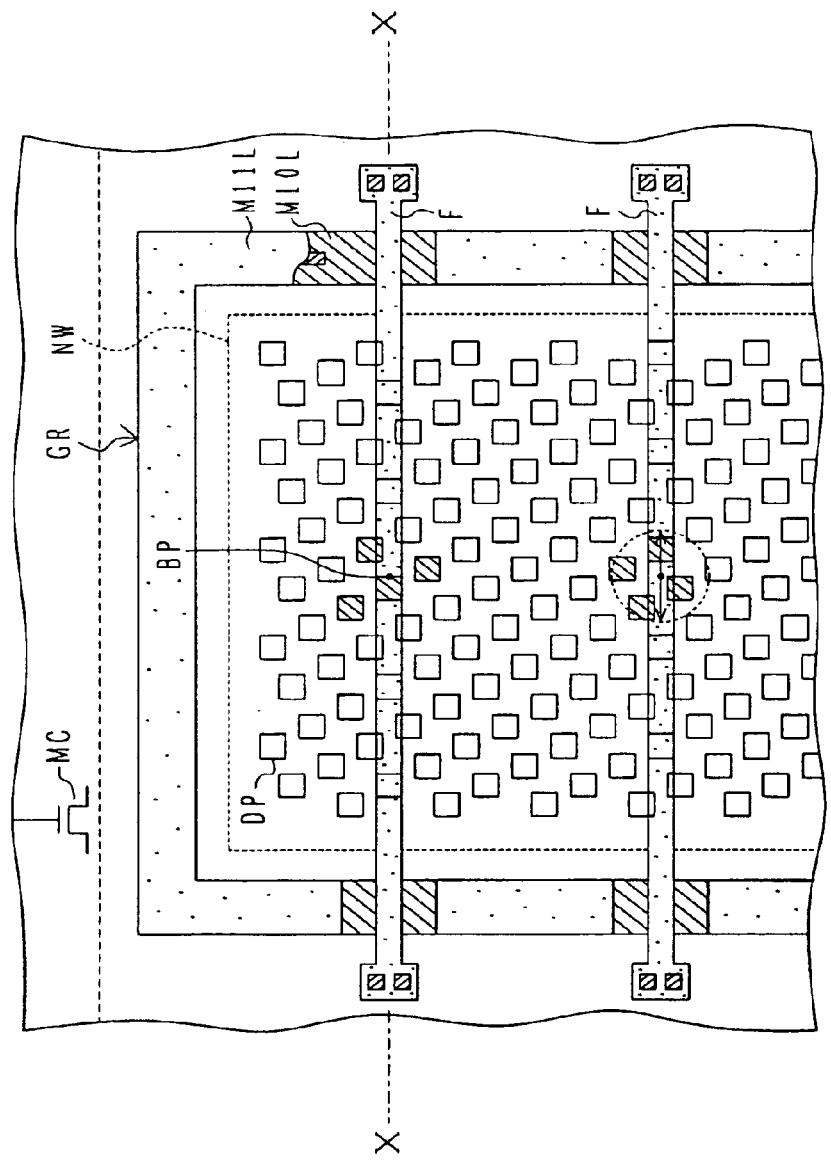
FIG. 10 is a plan view showing the layout of fuse elements according to related art.

FIG. 10 shows an example of a plan layout of a fuse circuit. In a fuse area surrounded by a guard ring GR, a plurality of fuses F are formed. At the level lower than that of the fuse F, dummy patterns DP are disposed. A dummy pattern is an active region dummy, a gate electrode dummy or a lamination thereof such as shown in FIG. 9I. Under the dummy patterns, an n-type well NW is formed. The fuse F is broken or cut by applying a laser beam at a predetermined position BP of the fuse F. The fuse F is made of, for example, aluminum or tungsten.

In a multilevel wiring structure, Cu is now commonly used as the material of a lower level wiring. If aluminum or tungsten is used as the material of the uppermost level wiring, fuses F are formed at the same time when the uppermost level wiring is formed. If the dummy patterns DP are disposed by automatic design and the fuses F are designed independently from the dummy patterns DP, the layout of the dummy patterns DP under respective fuses F become different. The fuse F in the upper portion and the fuse F in the lower portion in FIG. 10 have different layouts of the dummy patterns DP under the fuses F near the breaking point BP.

The state under the breaking point is different because the layout of the dummy patterns DP under the breaking point is different. This difference influences the fuse breaking process upon application of a laser beam, resulting in an unstable process having a small margin.

For example, depending upon whether or not there is a dummy just under the breaking point, the reflectivity of a laser beam on the surface of the semiconductor substrate changes so that the optimum breaking conditions change. If a polysilicon gate electrode dummy or a silicidated active region dummy is disposed just under the breaking point, not only the reflectivity of a laser beam is influenced but also the dummy pattern DP absorbs the laser beam and this may cause some damage to the semiconductor substrate.

Description will be given on the embodiments of the invention.

Figure 1:
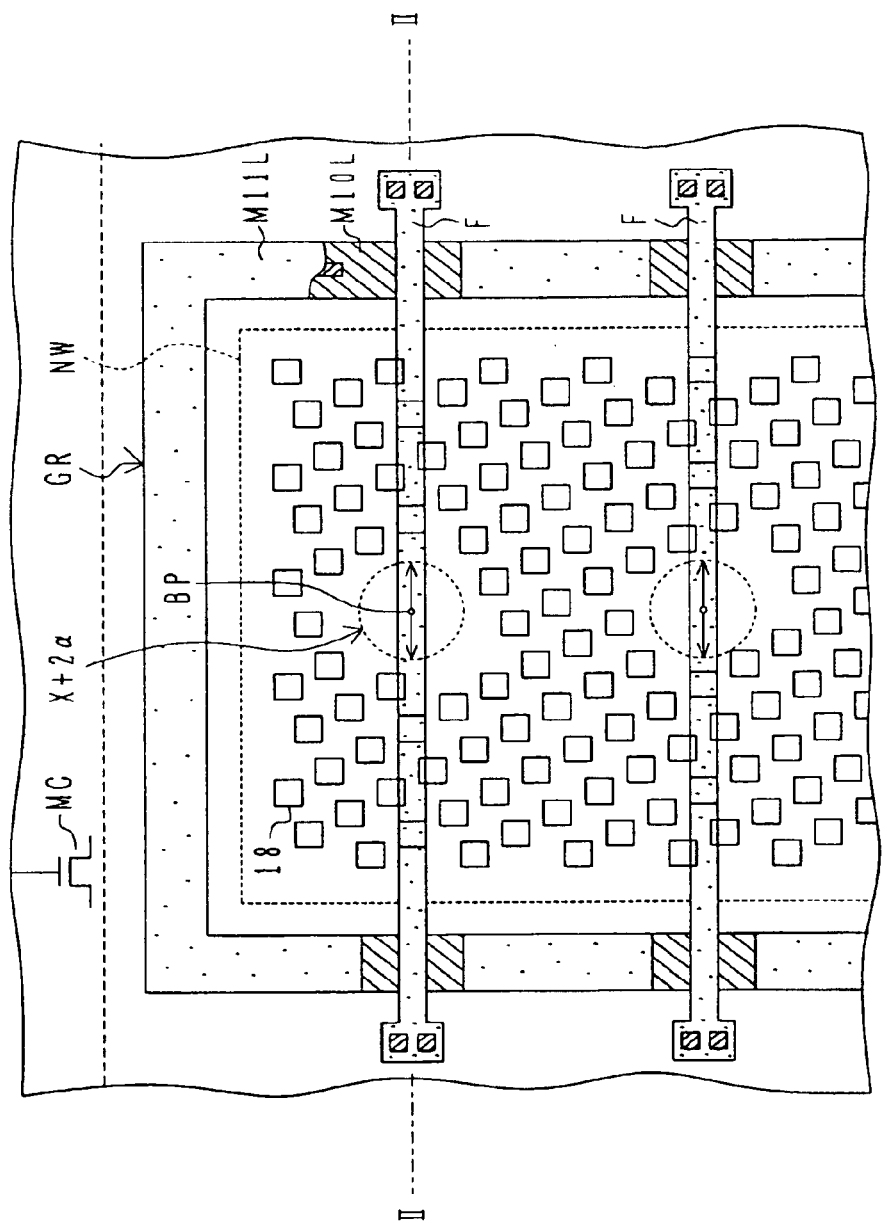
FIG. 1 is a partial plan view of a semiconductor device according to a first embodiment of the invention.

FIG. 1 is a plan view showing the structure of a semiconductor device according to a first embodiment of the invention. For example, the semiconductor device has eleven multilevel wiring layers. A main circuit area MC is disposed in the upper area as viewed in FIG. 1. Formed in this main circuit area MC are MOS transistors, active region dummies 18 and gate electrode dummies 19 such as those described with FIGS. 9A to 9H. A guard ring GR of a loop shape surrounds a fuse circuit area, the guard ring being made of the same metal layers as the multilevel wiring layers.

Active region dummies 18 are also disposed in the fuse circuit area. Fuse elements F are made of the uppermost eleventh wiring layer M11L and disposed traversing the fuse circuit area above the active region dummies 18.

A breaking point BP is designed or set to each fuse element F. The active region dummy 18 is not formed in a region having a diameter of $X+2\alpha$ with the center being set to the breaking point BP. X represents a spot diameter of a laser beam and $\alpha$ represents a position misalignment between the spot and the fuse breaking point BP.

If the center of a laser beam is set to the breaking point, the laser beam is irradiated in the region having a radius of $X/2$ from the center. If the center of a laser beam is displaced by $\alpha$, the laser beam can be irradiated in the region having a radius of $X/2+\alpha$ (diameter of $X+2\alpha$) from the breaking point BP. The active region dummy 18 is not disposed in the region where a laser beam can be irradiated. For example, the active region dummies 18 are not disposed in the region having a radius of 2 $\mu$m from the breaking point BP.

Figure 2:
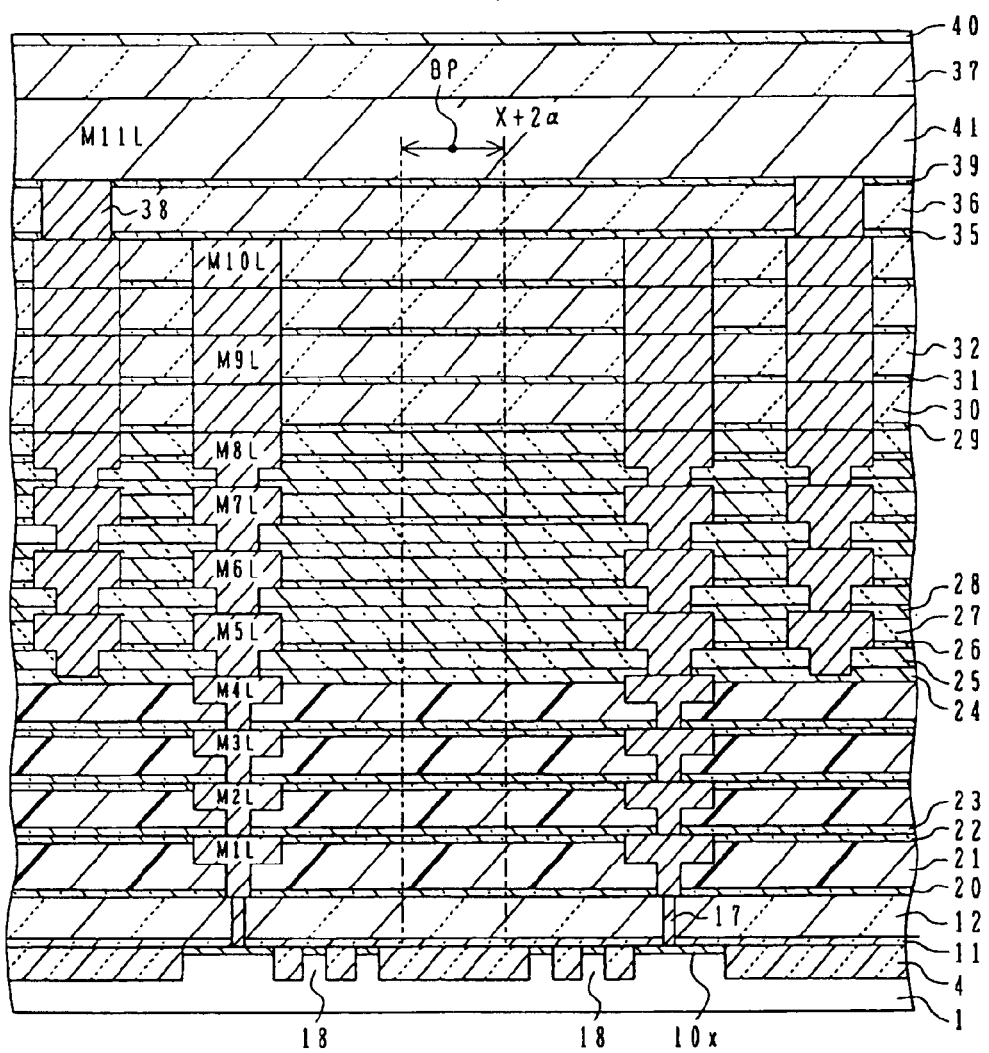
FIG. 2 is a partial cross sectional view of the semiconductor device of the first embodiment.

FIG. 2 is a cross sectional view showing the fuse circuit and taken along line II—II shown in FIG. 1.

An isolation or element separation region 4 of shallow trench isolation (STI) is formed in the surface layer of a silicon substrate 1. Active dummy regions 18 are also formed in the fuse circuit area by partially removing the isolation region 4. A silicide layer 10x is formed on the surface of the active region dummy 18. A silicon nitride layer 11 is formed covering the silicide layer 10x.

On the surface of the silicon nitride layer 11, an interlayer insulating film 12 of silicon oxide or the like is formed. Contact plugs 13 (FIG. 9H) are formed through the interlayer insulating film 12 and silicon nitride layer 11. A guard ring 17 of a ring shape is formed by the same process as that of forming the contact plug 13.

Covering the contact plugs 13 and guard ring 17, a Cu diffusion preventive and etch stopper layer 20 of SiN, SiC or the like is formed to a thickness of about 50 nm on the surface of the interlayer insulating film 12. On the diffusion preventive and etch stopper layer 20, an insulating layer 21 is formed to a thickness of, for example, about 500 nm. The insulating layer 21 is made of silicon oxide, SiLK (registered trademark) or the like. On the surface of the insulating layer 21, a hard mask layer 25 of SiN, SiC or the like is deposited to a thickness of about 50 nm for example. Via holes and wiring trenches are formed by anisotropic etching using a photoresist process. The photoresist pattern is removed and thereafter, a barrier metal layer of TaN or the like and a Cu seed metal layer are formed by sputtering. A metal material layer of Cu or the like is filled or buried in the via holes and wiring trenches by plating.

An unnecessary metal layer on the surface of the hard mask layer 22 is removed by CMP. In this manner, a first wiring layer M1L is formed. After the first wiring layer M1L is formed, a Cu diffusion preventive and etch stopper layer 23 of SiN, SiC or the like is formed to a thickness of about 50 nm on the substrate surface. Second to fourth wiring layers M2L to M4L are formed having the structure similar to that of the first wiring layer M1L.

On the surface of the fourth wiring layer M4L, a Cu diffusion preventive layer 24 of SiN or the like having a thickness of about 70 nm, an insulating layer 25 of silicon oxide, SiOC or the like having a thickness of about 330 nm, an etch stopper layer 26 of SiN, SiC or the like having a thickness of about 30 nm and an insulating layer 27 of silicon oxide, SiOC or the like having a thickness of about 350 nm are laminated. Wiring trenches and via holes are formed through this insulating layer structure. A barrier metal layer of TaN or the like and a seed metal layer of Cu or the like are formed by sputtering. A metal material layer of Cu or the like is filled or buried in the via holes and wiring trenches by plating. An unnecessary metal layer on the surface of the insulating layer structure is removed by CMP. In this manner, a fifth wiring layer M5L is formed. Sixth to eighth wiring layers M6L to M8L are formed having the structure similar to that of the fifth wiring layer M5L.

On the surface of the eighth wiring layer M8L, a Cu diffusion preventive layer 29 of SiN, SiC or the like having a thickness of about 70 nm, an insulating layer 30 of silicon oxide, SiOC or the like having a thickness of about 530 nm, an etch stopper layer 31 of SiN, SiC or the like having a thickness of about 20 nm and an insulating layer 32 of silicon oxide, SiOC or the like having a thickness of about 850 nm are laminated.

Wiring trenches and via holes are formed through this insulating layer structure. A barrier metal layer of TaN or the like and a Cu seed metal layer are formed by sputtering. A metal material layer is filled or buried in the via holes and wiring trenches by plating. An unnecessary metal layer on the surface of the insulating layer structure is removed by CMP. In this manner, a ninth wiring layer M9L is formed. A tenth wiring layer M10L is formed having the structure similar to that of the ninth wiring layer M9L.

On the tenth wiring layer M10L, a Cu diffusion preventive layer 35 of SiN, SiC or the like having a thickness of about 70 nm and an insulating layer 36 of silicon oxide or the like having a thickness of about 600 nm are laminated. A conductor 38 is buried through this insulating layer structure. According to necessity, an electrode layer 41 of aluminum or the like is deposited to a thickness of 1170 nm on an insulating layer 39 of SiC, SiN or the like. An eleventh wiring layer M11L including fuses is formed by anisotropic etching using a resist pattern. A silicon oxide layer 37, an SiN layer 40 and the like are laminated covering the eleventh wiring layer M11L. Selected regions of the silicon oxide layer 37 and SiN layer 40 are removed to form openings which expose pad electrodes and a fuse breaking region.

In this embodiment, the active region dummies 18 are formed in the fuse circuit area and the silicide layer 10x is formed on the surface of each active region dummy. The active region dummies 18 are not disposed in a selected area, e.g. a region having a radius of X/2+α from the fuse breaking point BP. Therefore, the active region dummies will not change the optimum conditions of laser irradiation and will not damage the substrate.

Figure 3:
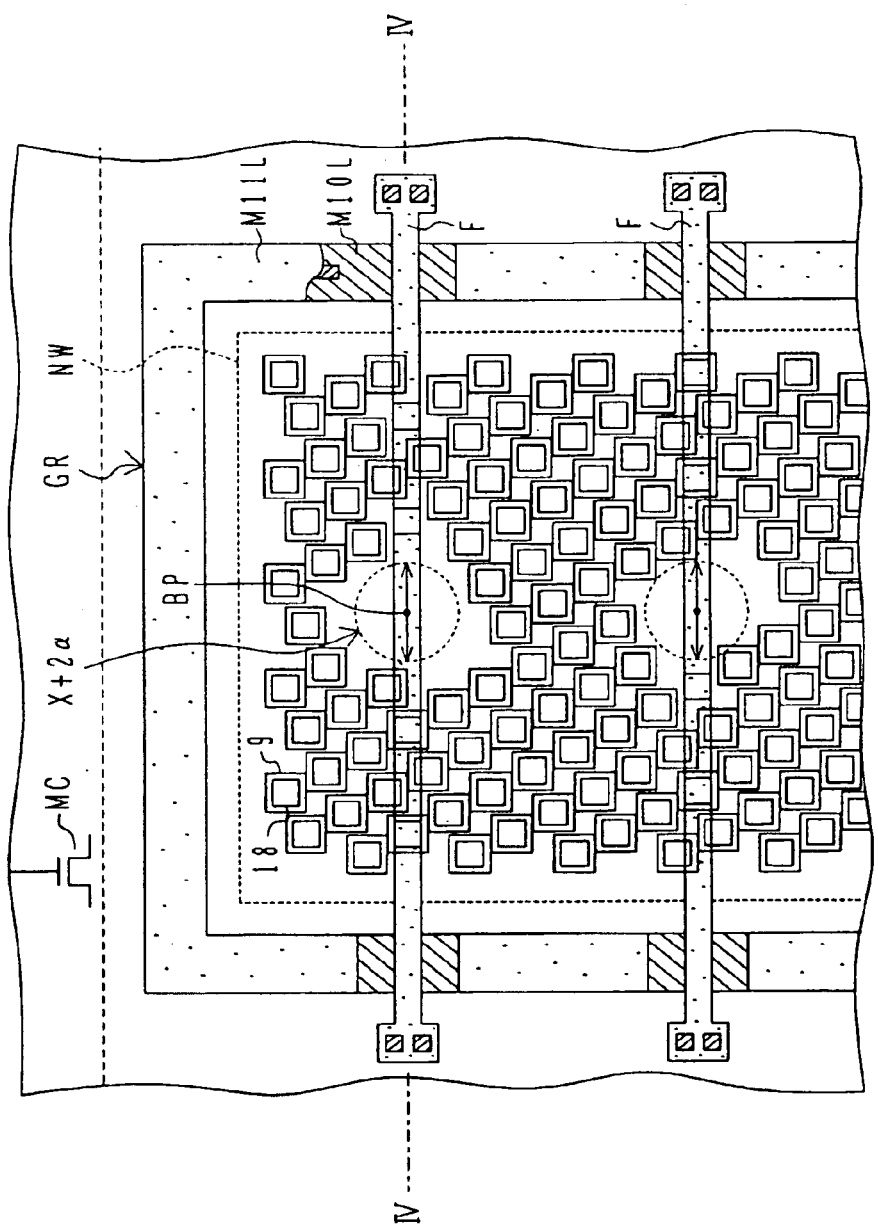
FIG. 3 is a partial plan view of a semiconductor device according to a modification of the first embodiment.
Figure 4:
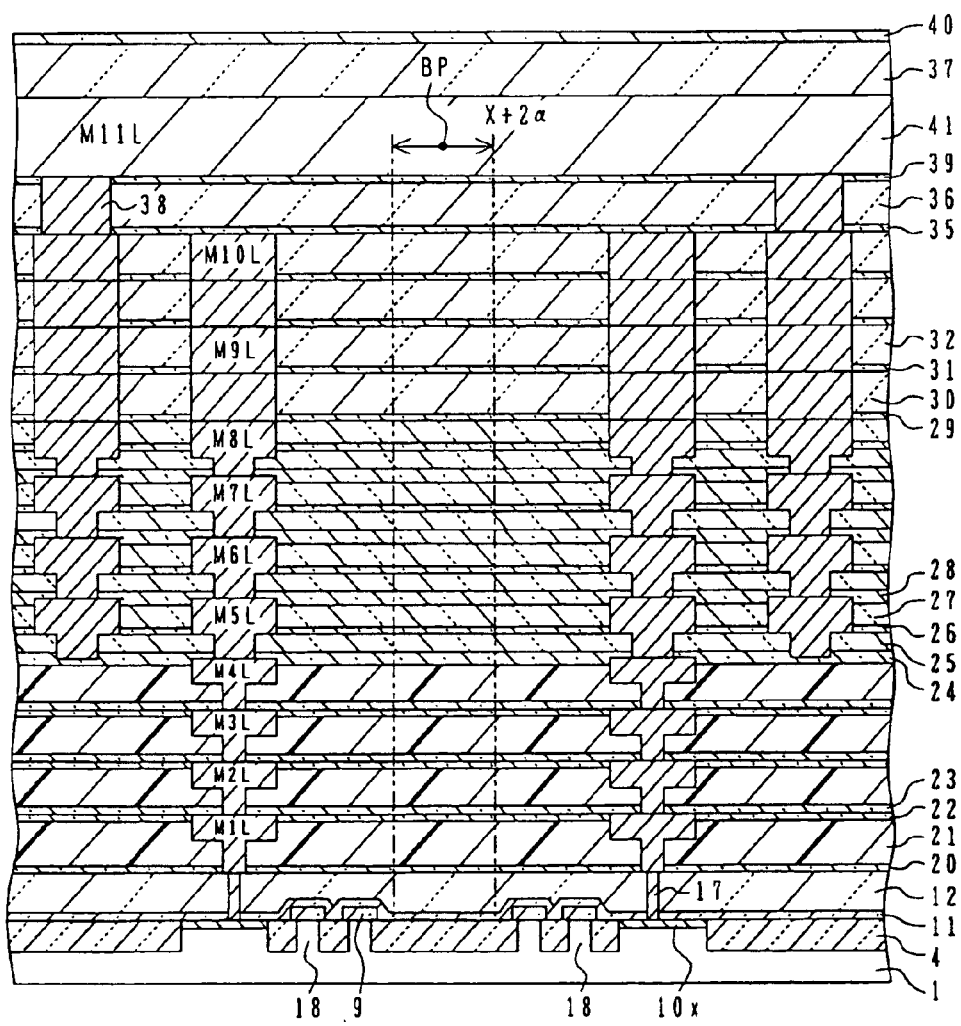
FIG. 4 is a partial cross sectional view of the semiconductor device according to the modification of the first embodiment.

FIGS. 3 and 4 shows a modification of the first embodiment. FIG. 3 is a plan view and FIG. 4 is a cross sectional view taken along line IV—IV shown in FIG. 3. In the first embodiment, the active region dummies 18 are not disposed in the region having a diameter of X+2α having as a center the fuse breaking point BP of each fuse F, and the silicide layer 10x is formed on the surface of the active region dummy 18.

In this modification, the surface of each active region dummy 18 is covered with an insulating layer 9. The surface of the active region dummy 18 is not silicidated because it is covered with an insulating film 9. The influence of the dummy layout during the fuse breaking process is less. The other points are similar to the first embodiment.

Figure 5:
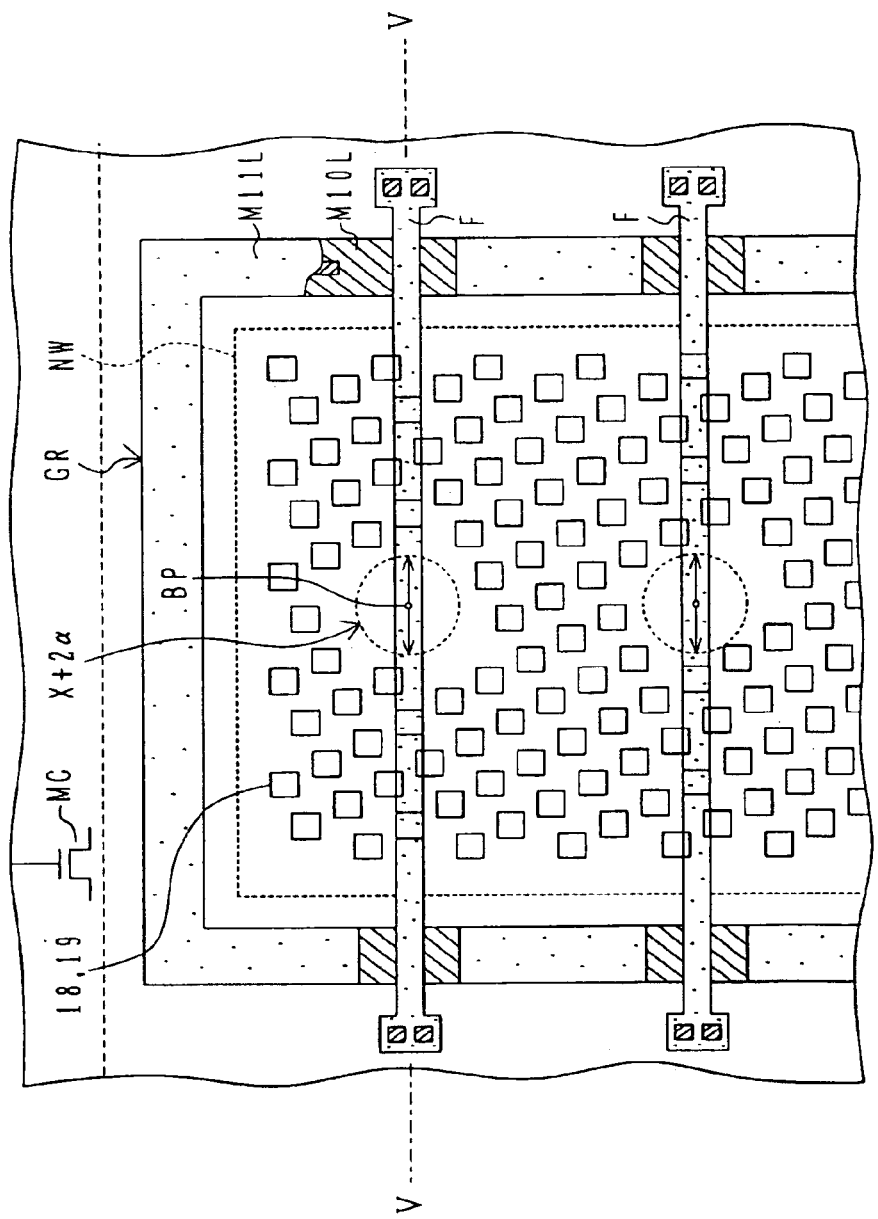
FIG. 5 is a partial plan view of a semiconductor device according to a second embodiment of the invention.
Figure 6:
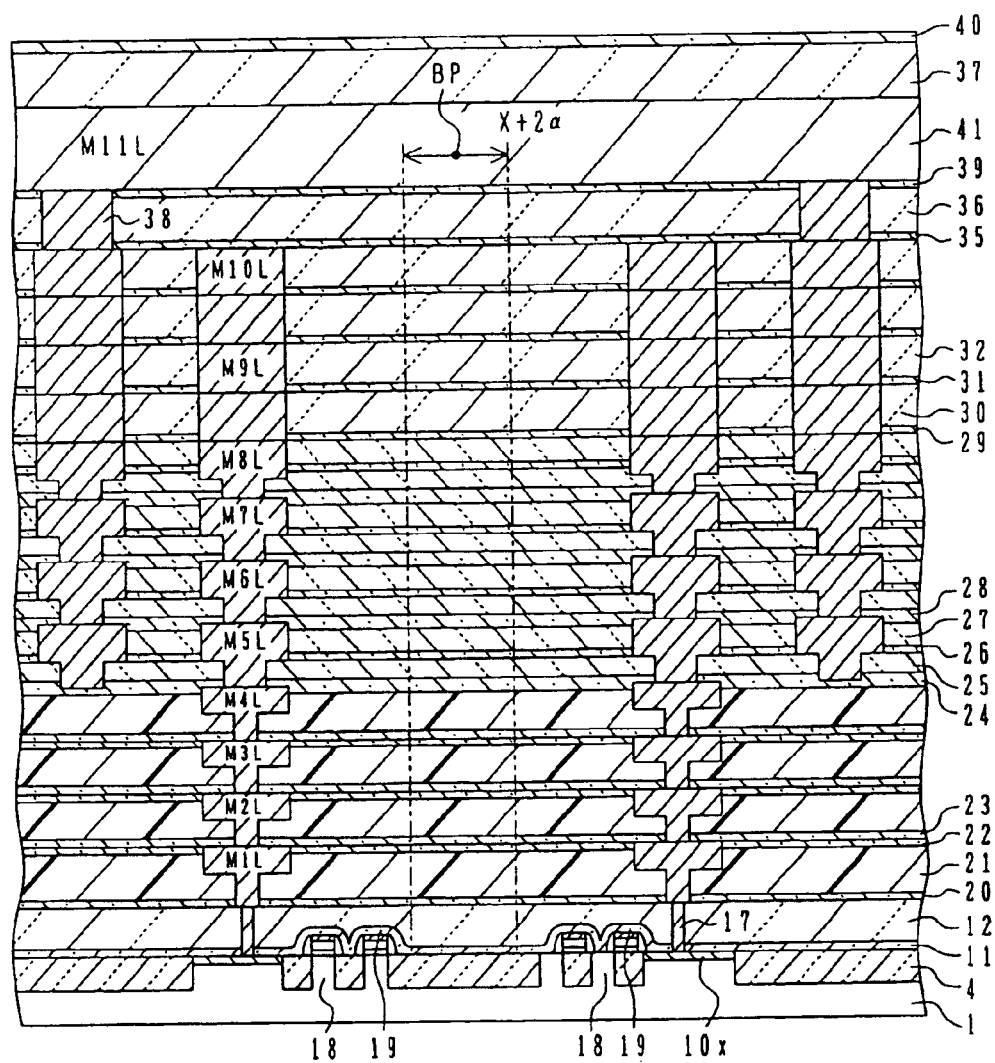
FIG. 6 is a partial cross sectional view of the semiconductor device of the second embodiment.

FIGS. 5 and 6 show the structure of a semiconductor device according to a second embodiment of the invention. FIG. 5 is a plan view and FIG. 6 is a cross sectional view taken along line V—V shown in FIG. 5.

In this embodiment, a dummy pattern is made of a lamination of an active region dummy 18 and a gate electrode dummy 19. The lamination dummies 18, 19 are not disposed in the region having a diameter of X+2α having as a center the fuse breaking point BP of each fuse F. Since the gate electrode dummy is used, a precision of gate electrode patterning in the main circuit area can be ensured, and since the dummy pattern is not disposed in the predetermined region around the breaking point in the fuse circuit area, a fuse breaking margin can be ensured. Damage to the substrate is also avoided. Other points are similar to the first embodiment.

Figure 7:
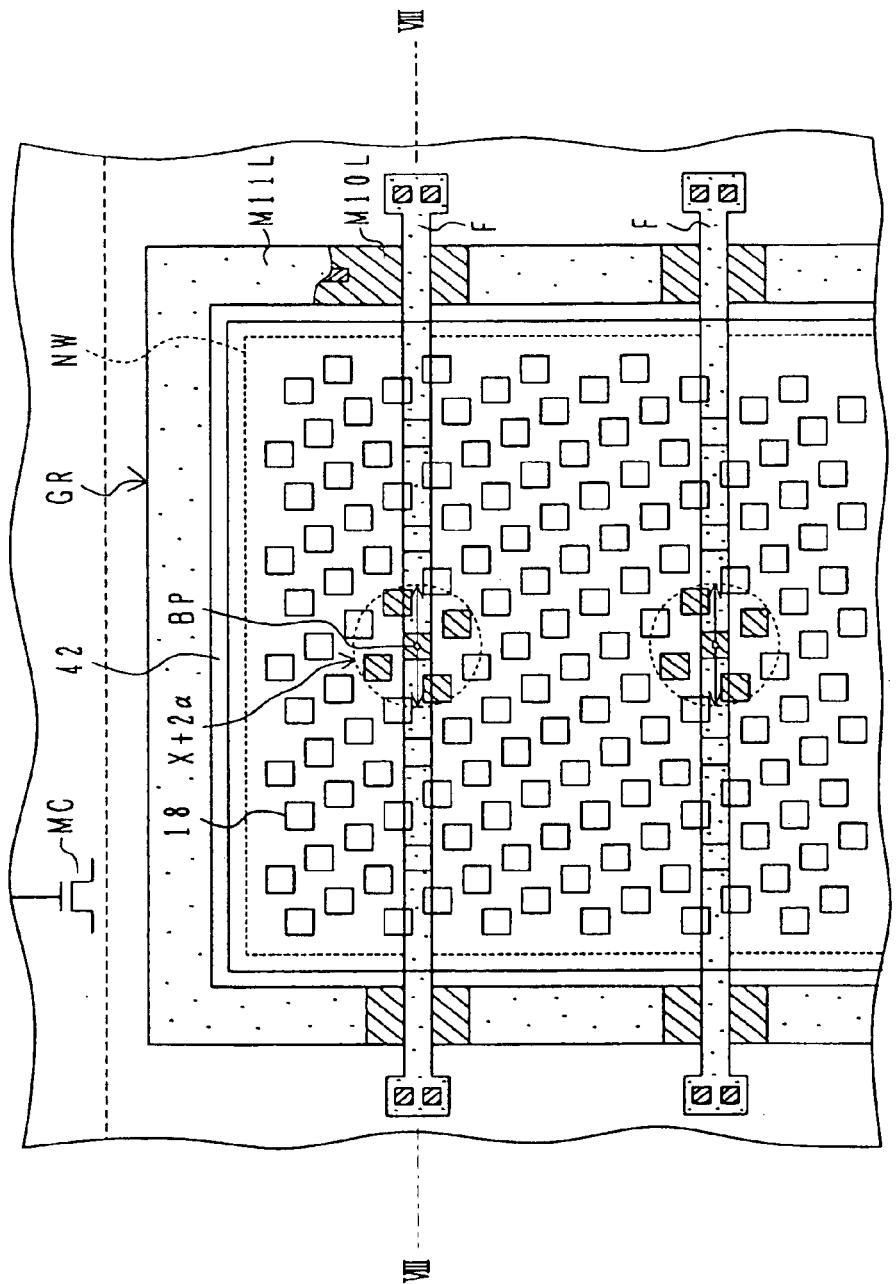
FIG. 7 is a partial plan view of a semiconductor device according to a third embodiment of the invention.
Figure 8:
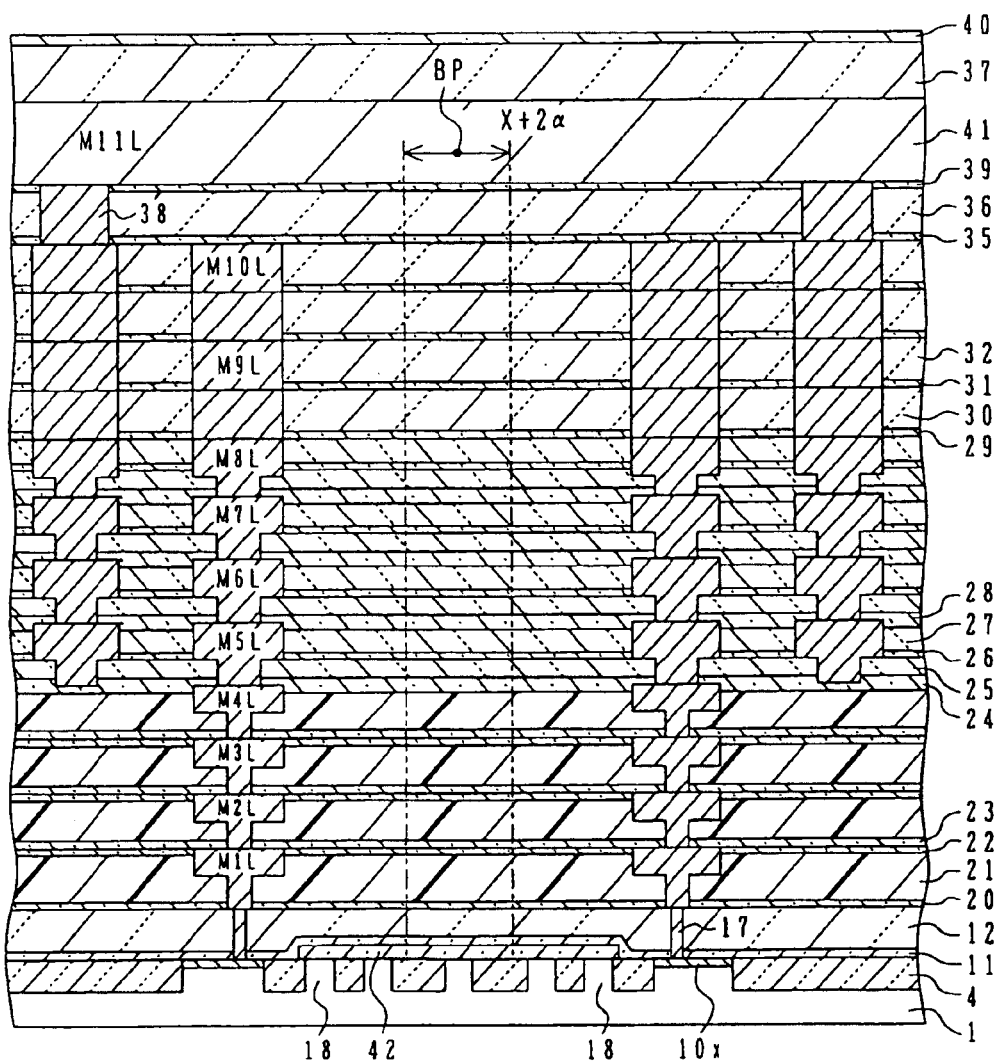
FIG. 8 is a partial cross sectional view of the semiconductor device of the third embodiment.

FIGS. 7 and 8 show a semiconductor device according to a third embodiment of the invention. FIG. 7 is a plan view and FIG. 8 is a cross sectional view taken along line VIII—VIII shown in FIG. 7.

In this embodiment, active region dummies are formed in the whole fuse circuit area. The active region dummies are disposed also under the breaking point BP. In the fuse circuit area, a continuous insulating film 42 is formed covering the surfaces of the active region dummies 18. The insulating film 42 prevents the surfaces of the active region dummies 18 from being silicidated.

The active region dummy 18 has an exposed silicon substrate surface. This silicon substrate surface is covered with the insulating film 42 of silicon oxide or the like. This structure is analogous to a silicon substrate under STI. Although a step structure exists, the influence upon laser beam reflection is considered to be less. Although the active region dummy 18 exists just under the breaking point BP, laser beam absorption is limitative because there is no polysilicon layer and silicide layer. It is therefore possible to ensure an operation margin and reduce damage to the substrate.

The present invention has been described in connection with the preferred embodiments. The invention is not limited only to the above embodiments. It will be apparent to those skilled in the art that other various modifications, improvements, combinations, and the like can be made.

We claim:

1. A semiconductor device comprising:
   a semiconductor substrate having a principal surface;
   a fuse circuit formed above the principal surface, said fuse circuit having fuse elements each having a predetermined breaking point;

a first trench isolation region formed in a surface layer of said semiconductor substrate under said fuse circuit; and a plurality of active region dummies formed through said first trench isolation region in an area excepting a predetermined area around the predetermined breaking point.

2. A semiconductor device according to claim 1, further comprising a silicide layer covering at least one of said active region dummies.

3. A semiconductor device according to claim 1, further comprising a plurality of insulating films each covering a semiconductor surface of an associated one of said active region dummies.

4. A semiconductor device according to claim 1, further comprising a continuous insulating film covering semiconductor surfaces of said active region dummies.

5. A semiconductor device according to claim 1, further comprising:

a second trench isolation region formed in the surface layer of said semiconductor substrate in an area different from said fuse circuit;

an active region formed through said second trench isolation region; and a main circuit including a MOS transistor comprising an insulated gate electrode formed traversing on a surface of said active region, source/drain regions formed in said active region on both sides of said insulated gate electrode, and silicide layers formed on surfaces of said source/drain regions.

6. A semiconductor device according to claim 1, further comprising a gate electrode dummy formed on at least one of said active region dummies.

7. A semiconductor device according to claim 1, wherein said predetermined area is a region having a predetermined radius.

8. A semiconductor device according to claim 1, further comprising a plurality of wiring layers having a via conductor and a wiring pattern, wherein said fuse circuit is surrounded by a guard ring made of the same layers as layers of the via conductor and the wiring pattern.

9. A semiconductor device comprising:

a semiconductor substrate having a principal surface;

a fuse circuit formed above the principal surface, said fuse circuit having fuse elements each having a predetermined breaking point;

a first trench isolation region formed in a surface layer of said semiconductor substrate under said fuse circuit;

a plurality of active region dummies formed through said first trench isolation region; and an insulating film covering a semiconductor surface of said active region dummies.

10. A semiconductor device according to claim 9, further comprising:

a second trench isolation region formed in the surface layer of said semiconductor substrate in an area different from said fuse circuit;

an active region formed through said second trench isolation region; and a main circuit including a MOS transistor comprising an insulated gate electrode formed traversing on a surface of said active region, source/drain regions formed in said active region on both sides of said insulated gate electrode, and silicide layers formed on surfaces of said source/drain regions, wherein semiconductor surfaces of said active region dummies have no silicide layer.

* * * * *